(12) United States Patent
Hedberg et al.

(10) Patent No.: US 6,831,517 B1
(45) Date of Patent: Dec. 14, 2004

(54) BIAS-MANAGEMENT SYSTEM AND METHOD FOR PROGRAMMABLE RF POWER AMPLIFIER

(75) Inventors: David J. Hedberg, Scottsdale, AZ (US); James B. Turner, Monroe, WA (US)

(73) Assignee: Intersil Americas, Inc., Milpitas, CA (US)

( * ) Notice: Subject to any disclaimer, the term of this patent is extended or adjusted under 35 U.S.C. 154(b) by 0 days.

(21) Appl. No.: 10/650,337

(22) Filed: Aug. 27, 2003

Related U.S. Application Data (60) Provisional application No. 60/436,157, filed on Dec. 23, 2002.

(51) Int. Cl.[7] .............................. H03G 3/10; H03F 3/04
(52) U.S. Cl. ........................ 330/285; 330/288; 330/289
(58) Field of Search ................................ 330/285, 288, 330/289

(56) References Cited

U.S. PATENT DOCUMENTS

| | | | |
|---|---|---|---|
| 5,241,283 A | * | 8/1993 | Sutterlin ....................... 330/51 |
| 5,268,649 A | | 12/1993 | Jones |
| 5,278,997 A | | 1/1994 | Martin |
| 5,311,143 A | | 5/1994 | Soliday |
| 6,414,553 B1 | | 7/2002 | Luo |
| 6,492,874 B1 | * | 12/2002 | Shih ........................... 330/288 |
| 6,535,066 B1 | | 3/2003 | Petsko |
| 6,559,722 B1 | | 5/2003 | Lopez et al. |
| 6,714,081 B1 | * | 3/2004 | Xu ............................. 330/296 |

* cited by examiner

Primary Examiner—Patricia Nguyen
(74) Attorney, Agent, or Firm—Jordan M. Meschkow; Lowell W. Gresham; Meschkow & Gresham, PLC (57) ABSTRACT

A system (100) and method (200) for adaptively managing bias of an RF power amplifier (102) is provided. The system (100) incorporates a controller (116) configured to select a radio operating mode. A current-mirror circuit (114) is coupled to the controller (116) and configured to produce a reference current ($I_{Ref}$) as a function of the radio operating mode. A bias regulator (104) is coupled to the controller (116) and the current-mirror circuit (114) and configured to produce a driver-stage bias current ($I_{b1}$) and an output-stage bias current ($I_{b2}$) for the power amplifier (102) in response to the reference current ($I_{Ref}$). The system (100) also incorporates a DC-to-DC converter (118) coupled to the controller (116) and configured to provide a supply voltage ($V_{cc}$) for the power amplifier (102) in response to the radio operating mode. The system (100) also incorporates an envelope detector (120) configured to produce an envelope current ($I_{Env}$) in response to an RF input signal (126). The system (100) causes the reference current ($I_{Ref}$) to vary as a function of the envelope current ($I_{Env}$).

26 Claims, 5 Drawing Sheets

BIAS-MANAGEMENT SYSTEM AND METHOD FOR PROGRAMMABLE RF POWER AMPLIFIER

RELATED INVENTION

The present invention claims benefit under 35 U.S.C. §119(e) to "Programmable RF Power Amplifier Bias Management System," U.S. Provisional Patent Application Serial No. 60/436,157, filed 23 Dec. 2002, which is incorporated by reference herein.

TECHNICAL FIELD OF THE INVENTION

The present invention relates to the field of transmitter power amplifiers. More specifically, the present invention relates to the field of energy conservation and linearity improvements in transmitter power amplifiers for wireless communications systems.

BACKGROUND OF THE INVENTION

The demands for low cost and power efficient wireless local-area network (WLAN) radios capable of providing a wide range of data rates and operating modes have recently accelerated. This has put more emphasis on achieving low cost radios with low power consumption. Particularly with requirements for integrated radios that operate with both direct-sequence spread spectrum (DSSS) coded waveforms and orthogonal frequency-division multiplexing (OFDM) waveforms as found in the IEEE 802.11a, b, g, and h standards, the transmitter power amplifier should be capable of efficient operation in several transmission modes and at several transmit power levels. The DSSS PSK and complementary code keying (CCK) waveforms of the IEEE 802.11b standard typically have lower peak to average ratio envelope distributions than the OFDM waveforms required in IEEE 802.11a and g standards. Moreover, efficient transmissions of OFDM waveforms at different data rates may utilize different amounts of power-amplifier backoff from the compression point to maintain optimum output power and signal fidelity. Transmitted OFDM waveforms for IEEE 802.11a and g modes can have peak-to-average ratios of 12 dB or more in the highest data rate modes. The later modes typically require a greater amount of linearity for a given output power than for the lower data rate modes.

Historically, RF power amplifiers have had to accommodate a smaller range of requirements. This allowed them to be implemented with fixed voltage and current bias techniques. Typical IEEE 802.11b "Wireless Fidelity" (WiFi) radios utilize a fixed-bias class-A or class-AB biased RF power amplifier. Similarly, for IEEE 802.11a OFDM radios, a fixed bias class A or highly biased class-AB RF power amplifier is common. Due to the linearity demands of OFDM transmission at higher data rates, if fixed bias is used, the power amplifier output capability must be sized larger in order to transmit at similar power levels as with the less demanding IEEE 802.11b modulation modes.

A commonly applied technique to improve linearity in power amplifiers is to increase the quiescent current so that the output transistor operates in a more linear portion of the I/V curve. However, higher quiescent current also results in greater power consumption during times when the power amplifier is transmitting. For maximum efficiency in a class-AB biased amplifier, the bias current and voltage should be selected carefully for transmit mode and output power level required. Improved efficiency results if the quiescent current and power-amplifier supply voltages are varied dynamically with the instantaneous power (envelope) of the transmitted signal. But optimizing the bias current and voltage for each signal level is difficult in a highly integrated radio product that is constrained by integrated-circuit (IC) technology cost and power efficiency considerations.

Improved power amplifier characteristics (e.g., linearity and maximum power output) and efficiency generally accrue when the IC process technology is well matched to the frequency range and circuit requirements of the power amplifier. Unfortunately, highest power amplifier performance levels can best be achieved with processes that also tend to be more costly and limited in circuit integration capabilities, e.g., gallium-arsenide (GaAs) metal semiconductor field-effect transistor (MESFET) and heterojunction bipolar transistor (HBT) technologies. This has inhibited the use of sophisticated biasing and bias management circuits within the RF power amplifier ICs in the highest performance applications, which could benefit from such circuits, because they could not be integrated easily due to device and cost constraints of the RF power amplifier IC processes.

On the other hand, the RF transceiver and radio ICs are implemented today as complex mixed signal circuits. These systems are desirably highly integrated in minimum cost IC processes, e.g., complementary metal-oxide semiconductor (CMOS) or bipolar complementary metal-oxide semiconductor (BiCMOS) IC processes.

SUMMARY OF THE INVENTION

Accordingly, it is an advantage of the present invention that a bias-management system and method for a programmable RF power amplifier is provided.

It is another advantage of the present invention that a programmable bias-management system is provided that optimizes the performance of an RF power amplifier for multiple radio operating modes.

It is another advantage of the present invention that a bias-management system is provided in which a reference transistor of a bias regulator and an output transistor of a power amplifier are fabricated upon a common integrated-circuit substrate to provide close thermal coupling between the bias regulator and the power amplifier.

It is another advantage of the present invention that a bias-management system is provided in which a bias current for a power amplifier is dynamically adjusted as a function of an envelope of an input signal.

It is another advantage of the present invention that a bias-management system is provided in which a bias current for a power amplifier is dynamically adjusted to compensate for signal rectification within an output stage of the power amplifier.

The above and other advantages of the present invention are carried out in one form by an RF power-amplifier bias-management system incorporating a digitally programmed controller configured to according to a selected radio operating mode, a current-mirror circuit coupled to the controller and configured to produce a reference current as a function of the radio operating mode, a bias regulator coupled to the controller and the current-mirror circuit and configured to respond to the reference current, and a power-amplifier output stage coupled to the bias regulator and having a bias current determined by the bias regulator.

The above and other advantages of the present invention are carried out in another form by a method of adaptively controlling operation of an RF power amplifier. The method incorporates selecting a radio operating mode, producing a reference current in response to the selecting activity, establishing a bias current for an output stage of the power amplifier in response to the producing activity, and determining a supply voltage for the power amplifier in response to the selecting activity.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
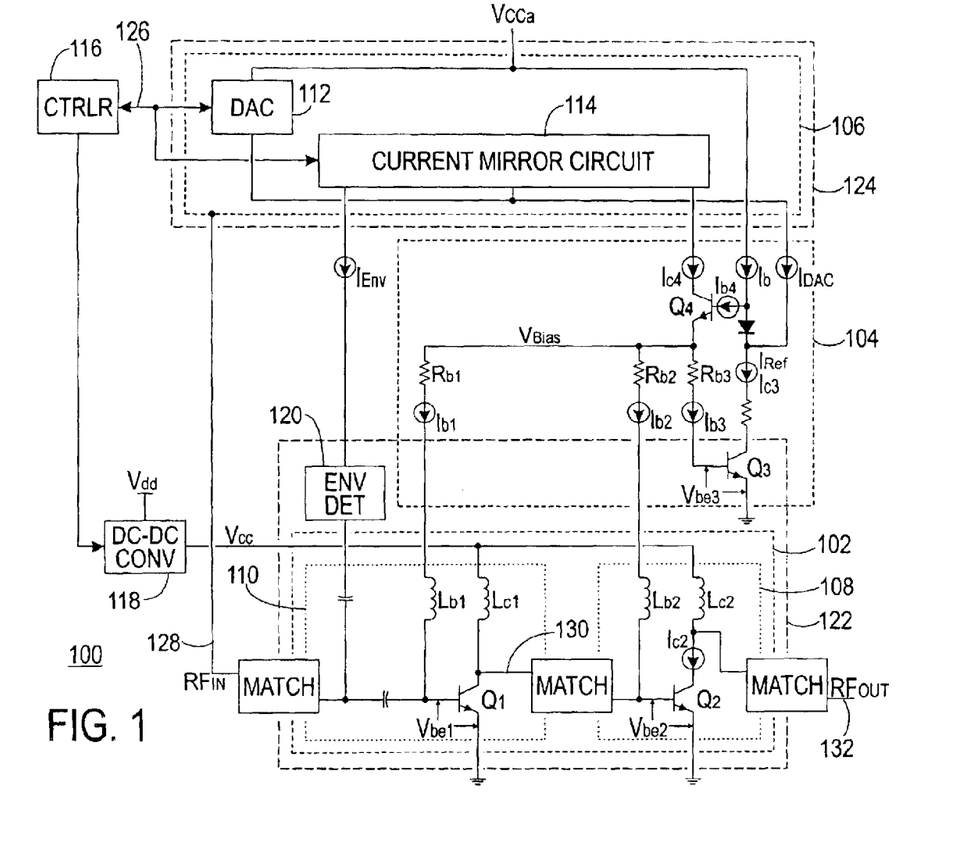
FIG. 1 depicts a schematic of an RF power-amplifier bias-management system in accordance with a preferred embodiment of the present invention.
Figure 2:
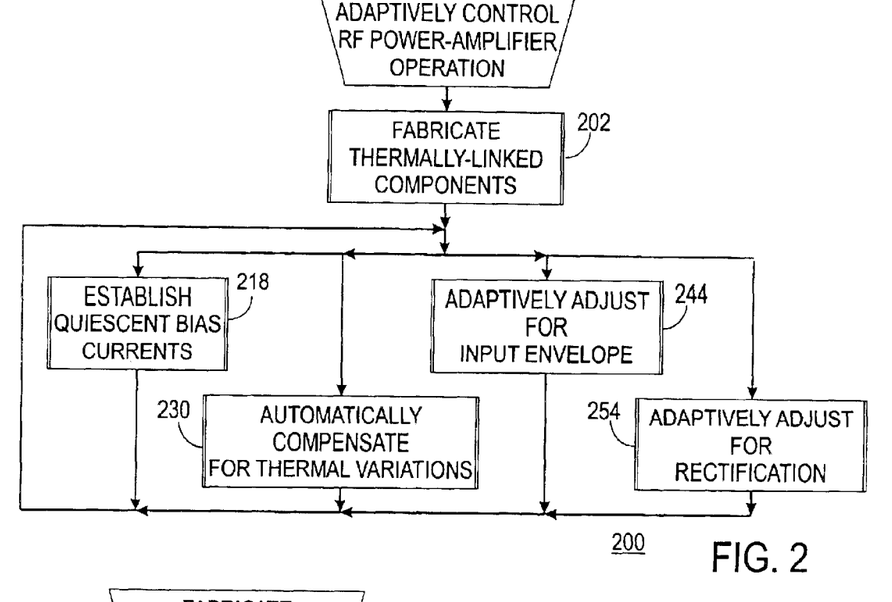
FIG. 2 depicts a flowchart of a process to adaptively control operation of an RF power amplifier in accordance with a preferred embodiment of the present invention.

FIG. 1 depicts a schematic of bias-management system 100 for an RF power-amplifier 102, and FIG. 2 depicts a flowchart of a process 200 to adaptively control operation of RF power amplifier 102 in accordance with a preferred embodiment of the present invention. The following discussion refers to FIGS. 1 and 2.

In the preferred embodiment of FIG. 1, power amplifier 102 is typical of a power amplifier configured to meet the requirements of direct-sequence spread spectrum (DSSS) coded waveforms and orthogonal frequency-division multiplexing (OFDM) transmissions as found in the IEEE 802.11a, b, g, and h standards for a wireless local-area network (WLAN) radio (not shown). As such, RF power amplifier 102 should be capable of efficient operation in several transmission modes and at several transmit-power levels. For example, the DSSS phase-shift keying (PSK) and complementary code keying (CCK) waveforms of the IEEE 802.11b standard typically have lower peak-to-average ratio envelope distributions than the OFDM waveforms of the IEEE 802.11a and g standards. Thus, the PSK and CCK mode waveforms of IEEE 802.11b can be transmitted at a higher output power level using less output power back-off than for the OFDM mode waveforms that have higher peak-to-average power ratios.

Those skilled in the art will appreciate that bias-management system 100 as depicted in FIG. 1 is exemplary, and that other embodiments of RF power-amplifier 102 and/or other components of system 100 may be implemented without departing from the spirit of the present invention.

Bias-management system 100 includes three primary sections: RF power amplifier 102; a bias regulator 104; and a bias reference current preprocessor 106. RF power amplifier 102 contains an output stage 108 and a gain or driver stage 110. Preprocessor 106 contains a digital-to-analog converter (DAC) 112 and a current-mirror circuit 114. Also included in the preferred embodiment of system 100 are a system controller 116, a dc-to-dc converter 118, and an envelope detector 120. Each of these basic components of system 100 is discussed in detail hereinafter.

Figure 3:
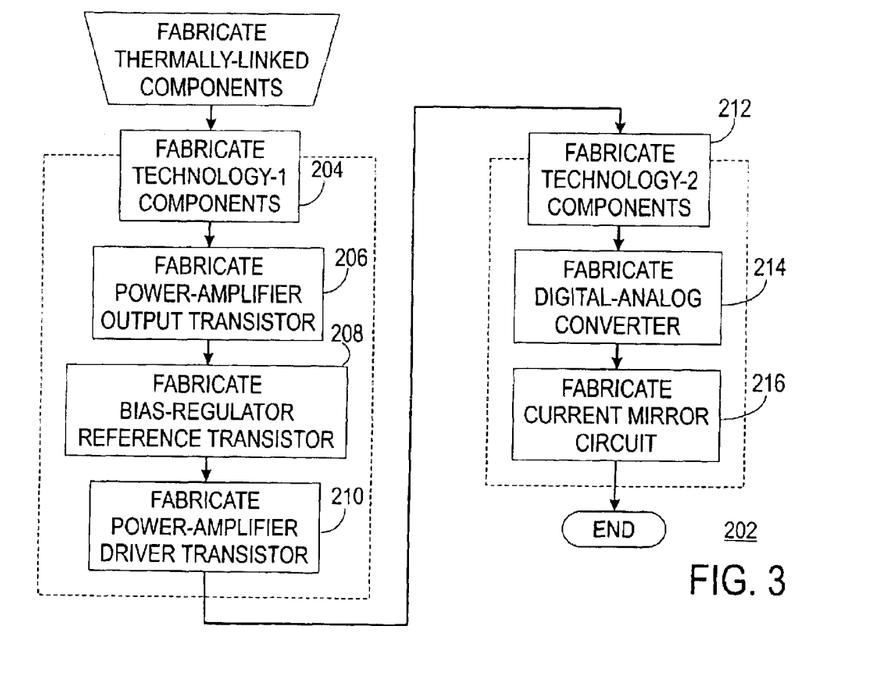
FIG. 3 depicts a flowchart of a subprocess to fabricate thermally linked components for a bias-management system in accordance with a preferred embodiment of the present invention.

FIG. 3 depicts a flowchart of a subprocess 202 to fabricate thermally linked components for bias-management system 100 in accordance with a preferred embodiment of the present invention. The following discussion refers to FIGS. 1, 2, and 3.

Conventionally, the components of an RF power amplifier are fabricated upon a first substrate using a first integrated circuit (IC) technology suited to power-amplifier applications, i.e., with a process technology capable of providing the necessary power at the desired transmission frequencies. Similarly, the components of other portions of a WLAN radio are conventionally fabricated upon a second substrate using a second IC technology suited to the support circuitry, i.e., having the lowest cost at the desired frequencies. This is true of the present invention as well, where RF power amplifier 102 is fabricated upon a first substrate 122 and preprocessor 106 is fabricated upon a second substrate 124.

In the present invention, however, it is highly desirable that an output transistor $Q_2$ of RF power amplifier 102 be thermally coupled to a reference transistor $Q_3$ of bias regulator 104. This is accomplished during the manufacture of physical components of a WLAN radio by fabricating specific components upon specific substrates in a subprocess 202 of operation process 200. Those skilled in the art will appreciate that the term "operation" in this discussion is taken to mean not only the operation of a finished and complete WLAN radio, but also those parts of the manufacturing process that affect the operation of the finished radio.

For simplicity, only those components of bias-management system 100 are discussed in fabrication subprocess 202. It is to be assumed that all other components, including those neither depicted in the Figures nor discussed herein, are also fabricated in manners well known to those skilled in the art.

In fabrication subprocess 202, a "hypertask" (i.e., a task of tasks) 204 fabricates all those components that are to be fabricated upon first substrate 122 using a first IC technology. In a task 206 of hypertask 204, that portion of output stage 108 of power amplifier 102 containing output transistor $Q_2$ is fabricated. Similarly, in a task 208 of hypertask 204, that portion of bias regulator 204 containing reference transistor $Q_3$ within bias regulator 104 is fabricated. By being fabricated upon a common substrate 122, output transistor $Q_2$ and reference transistor $Q_3$ are thermally coupled such that a change in the characteristics of output transistor $Q_2$ due to thermal variations produces a corresponding change in the characteristics of reference transistor $Q_3$. In addition, fabrication on a common substrate results in correlated process-dependent characteristics such as $V_{be}$ match, which ensures the current ratio in these transistors are determined by size ratio and not process characteristic differences.

To a lesser degree, it is desirable that that portion of driver stage 110 of power amplifier 102 containing driver transistor $Q_1$ also be thermally matched and characteristically matched to output transistor $Q_2$. This is effected by a in a task 210 of hypertask 204, wherein driver transistor $Q_1$ is fabricated.

Desirably, the IC technology used for the fabrication of transistors $Q_1$, $Q_2$, and $Q_3$ (along with various other components) is a technology that is suitable for use with RF power amplifier 102. In the preferred embodiment, this technology is a heterojunction bipolar transistor (HBT) technology, though it will be understood that this is not a requirement of the present invention.

Those skilled in the art will appreciate that the process flow discussed herein in conjunction with hypertask 204 of subprocess 202 does not indicate sequence. For example, that tasks 206, 208, and 210 of hypertask 204 would be effected substantially simultaneously. That is, output, reference, and driver transistors $Q_2$, $Q_3$, and $Q_1$ would be substantially simultaneously fabricated upon substrate 122.

Also in fabrication subprocess 202, a hypertask 212 fabricates preprocessor 106 and other components that are to be fabricated upon second substrate 124 using a second IC technology. In a task 214, DAC 112 is fabricated, and in a task 216, current-mirror circuit 114 is fabricated.

Desirably, the IC technology used for the fabrication of DAC 112 and current-mirror circuits 114 is a technology that is suitable for use with large scale integration of radio transceiver circuits or a mixed signal system-on-a-chip IC. In the preferred embodiment, this technology is complementary metal-oxide semiconductor (CMOS) or bipolar complementary metal-oxide semiconductor (BiCMOS) technology, though it will be understood that this is not a requirement of the present invention.

Those skilled in the art will again appreciate that the process flow discussed herein in conjunction with hypertask 212 of subprocess 202 does not indicate sequence. For example, tasks 214 and 216 of hypertask 212 would be effected substantially simultaneously.

It may be seen in FIG. 1 that bias regulator 104 also contains a source transistor $Q_4$. In the preferred embodiment, source transistor $Q_4$ need not be thermally coupled to output transistor $Q_2$. Therefore, though not shown in FIG. 3, source transistor $Q_4$ may be fabricated on first substrate 122 by hypertask 204 using the first IC technology, or on second substrate 124 by hypertask 212 using the second IC technology. In practice, source transistor $Q_4$ would normally be fabricated on whichever one of substrates 122 or 124 is more cost effective. Alternatively, source transistor $Q_4$ could be implemented as a low-cost discrete part if neither substrate 122 nor 124 can provide the needed device characteristics.

In the present invention, bias currents $I_{b1}$ and $I_{b2}$ for driver and output transistors $Q_1$ and $Q_2$, respectively, are produced and controlled by bias regulator 104. Each of bias currents $I_{b1}$ and $I_{b2}$ has a quiescent component and a dynamic component. The quiescent component is a DC (no-signal) bias-current value. The dynamic component is a dynamic variation superimposed upon the quiescent component in response to the signal. Alternatively, driver-transistor bias current $I_{b1}$ can be connected to a fixed source, independent of bias regulator 104.

Before the dynamic component can be superimposed upon the quiescent component, the quiescent components of bias currents $I_{b1}$ and $I_{b2}$, must first be established. To this end, bias-management system 100 is momentarily assumed to be simplified by the omission of controller 116, DC-to-DC converter 118, preprocessor 106 (i.e., DAC 112 and current mirror circuit 114), and envelope detector 120. As a result, the power source for transistors $Q_1$, $Q_2$, and $Q_4$ are momentarily presumed to be system primary voltage $V_{dd}$.

Quiescent DC bias current $I_{b2}$ for output transistor $Q_2$ is set by setting a bias reference current $I_{Ref}$. Typically, a ratio N of a size of output transistor $Q_2$ to a size of reference transistor $Q_3$, and a corresponding ratio in the resistances of their base resistors $R_{b2}$ and $R_{b3}$, will be set so that a quiescent DC collector current $I_{c2}$ in output transistor $Q_2$ will be a factor of N times greater than bias reference current $I_{Ref}$. The resultant DC base-emitter voltages $V_{be2}$ and $V_{be3}$ of output transistor $Q_2$ and reference transistor $Q_3$ will be substantially equal. A typical relationship is given in the following equations:

$$I_{c2}=I_{Ref}/N; \tag{1}$$

$$R_{b3}=N \cdot R_{b2}; \tag{2}$$

and $$V_{be3} \cong V_{be2}. \tag{3}$$

Since, as discussed hereinbefore, output transistor $Q_2$ and reference transistor $Q_3$ are formed upon common substrate 122, base-emitter voltage $V_{be2}$ and $V_{be3}$ will tend to track with temperature and process variations. This results in a substantially constant ratio between output-transistor collector current $I_{c2}$ and reference current $I_{Ref}$.

Reference transistor $Q_3$ is fabricated on a common substrate 122 with output transistor $Q_2$. As discussed hereinbefore, driver transistor $Q_1$ is also fabricated upon common substrate 122. Therefore, quiescent DC bias current $I_{b1}$ for driver transistor $Q_1$ is also set by reference current $I_{Ref}$, as determined by a ratio M of a size of driver transistor $Q_1$ to the size of reference transistor $Q_3$, and a corresponding ratio in the resistances of their base resistors $R_{b1}$ and $R_{b3}$. The resultant DC base-emitter voltages $V_{be1}$, $V_{be2}$, and $V_{be3}$ of driver transistor $Q_1$, output transistor $Q_2$, and reference transistor $Q_3$ will all be substantially equal, and will all tend to track with temperature and process variations. A typical relationship is given in the following equations:

$$I_{c1}=I_{Ref}/M; \tag{4}$$

$$R_{b3}=N \cdot R_{b1}; \tag{5}$$

and $$V_{be3} \cong V_{be2} \cong V_{be1}. \tag{6}$$

The matching of the electrical and thermal characteristics of transistors $Q_1$, $Q_2$, and $Q_3$ is advantageous. Because of this, transistors $Q_1$, $Q_2$, and $Q_3$ are fabricated on common substrate 122. Bias-regulator source transistor $Q_4$ sources the bias (base) currents $I_{b1}$, $I_{b2}$, and $I_{b3}$ of driver transistor $Q_1$, output transistor $Q_2$, and reference transistor $Q_3$. Source transistor $Q_4$ does not require matched characteristics, and therefore may be fabricated elsewhere than on common substrate 122, if desired. In practice, source transistor $Q_4$ may be fabricated upon power-amplifier substrate 122 or preprocessor substrate 124, whichever realizes the most effective fiscal solution.

The DC base bias currents in $Q_1$, $Q_2$, and $Q_3$ depend directly on a bias source voltage $V_{Bias}$ from the emitter of source transistor $Q_4$:

$$V_{Bias}=V_{be1}+R_{b1} \cdot I_{b1}=V_{be2}+R_{b2}I_{b2}=V_{be3}+R_{b3}I_{b3}. \quad (7)$$

Figure 4:
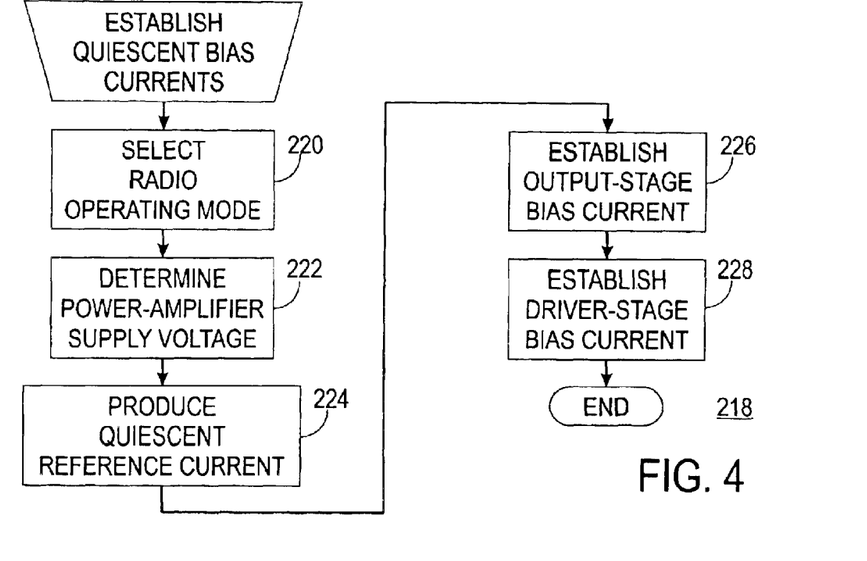
FIG. 4 depicts a flowchart of a subprocess to establish quiescent bias currents for an RF power amplifier in accordance with a preferred embodiment of the present invention.

FIG. 4 depicts a flowchart of a subprocess 218 to establish quiescent bias currents $Q_1$ and $Q_2$ for RF power amplifier 102 in accordance with a preferred embodiment of the present invention. The following discussion refers to FIGS. 1, 2, and 4. FIG. 1 is hereinafter considered in toto.

In subprocess 218, a task 220 selects an operating mode for the radio. Bias-management system 100 incorporates system controller 116. In the preferred embodiment, system controller 116 provides a typical media-access controller (MAC) function or the like. Those skilled in the art will appreciate that in some system-on-a-chip implementations, system controller 116 and preprocessor circuit 106 may be integrated on a common substrate. The implementation of system controller 116 and preprocessor circuit 106 on a common substrate does not depart from the spirit of the present invention.

System controller 116 is configured to select an operating mode for the radio in task 220. For example, a multi-mode WLAN radio may desirably operate as either an IEEE 802.11b or an IEEE 802.11g radio. The transmission demands of the DSSS waveforms of an IEEE 802.11b radio are different than the transmission demands of the OFDM waveforms of an IEEE 802.11g radio.

Those skilled in the art will appreciate that, when bias-management system 100 is used with a single-mode WLAN radio, then system controller 116 may be hardwired, i.e., effectively replaced by connections providing the appropriate signals to preprocessor 106, etc. The omission of controller 116 does not depart from the spirit of the present invention.

Controller 116 allows the operator (either human or computer) to select the radio operating mode and establish an appropriate set of conditions for power amplifier 102. This set of conditions may include a supply voltage $V_{cc}$ and driver-and output-transistor bias currents $I_{b1}$ and $I_{b2}$.

In a task 222 of subprocess 218, a suitable mode-specific supply voltage $V_{cc}$ is determined for power amplifier 102. An output of system controller 116 is passed to preprocessor 106 to allow establishment of specific quiescent bias currents $I_{b1}$ and $I_{b2}$ to optimize power amplifier 102 for a given mode of operation (discussed hereinafter). This leads to the realization that, in some modes of operation, power amplifier 102 is better optimized with a specific power-amplifier supply voltage $V_{cc}$, rather than system primary voltage $V_{dd}$. Therefore, it is desirable that power amplifier 102 be provided with mode-specific supply voltage $V_{cc}$.

Mode-specific supply voltage $V_{cc}$ is derived from system primary voltage $V_{dd}$ by high-efficiency switching DC-to-DC converter 118 under control of system controller 116. Supply voltage $V_{cc}$ is fed to the collectors of driver and output transistors $Q_1$ and $Q_2$ through collector inductors $L_{c1}$ and $L_{c2}$, respectively. In this manner, controller 116 optimizes power-amplifier supply voltage $V_{cc}$ for each mode of operation in a multi-mode WLAN radio. The inclusion of DC-to-DC converter 118 allows the achievement of greater efficiencies of power amplifier 102 that are possible otherwise.

Those skilled in the art will appreciate that some embodiments of the present invention may not require the use of DC-to-DC converter 118. For example, where power-amplifier supply voltage $V_{cc}$ has the same optimal value for all modes of operation peculiar to a specific WLAN radio, where the WLAN radio is a single-mode radio, or where a simpler implementation of bias-management system 100 is desired. In such a case, power-amplifier supply voltage $V_{cc}$ may be derived directly from system primary voltage $V_{dd}$. It will be appreciated that the omission of DC-to-DC converter 118 does not depart from the spirit of the present invention.

In a task 224 of subprocess 218, mode-specific quiescent reference current $I_{Ref}$ is produced. In task 220, discussed hereinbefore, system controller 116 selects the radio operating mode. This is passed to preprocessor 106 as operating-mode control signals 126. Control signals 126 pass to DAC 112 and to current-mirror circuit 114. Current-mirror circuit 114 produces a programmable dynamic bias current, which is summed with an output of DAC 112 to form a reference control current $I_{DAC}$. Collector current $I_{c4}$ of transistor $Q_4$ is supplied from a positive supply voltage $V_{cca}$, which is typically also the supply voltage for preprocessor circuit 106.

A small fixed bias source current $I_b$ is provided by preprocessor circuit 106 in order to provide a base current $I_{b4}$ for source transistor $Q_4$. In this circuit, fixed bias source current $I_b$ is substantially greater than a required source-transistor base current $I_b$. A reference current $I_{Ref}$ is therefore the sum of fixed bias source current $I_b$ (minus source-transistor base current $I_{b4}$) and reference control current $I_{DAC}$.

Reference current $I_{Ref}$ is much greater than source-transistor base current $I_{b4}$ (which is also a collector current IC3 of reference transistor Q3).

Reference current $I_{Ref}$ is therefore approximated by the following equations:

$$I_{Ref}=I_b+I_{DAC}-I_{b4}, \quad (8)$$

$$I_b >> I_{b4}, \quad (9)$$

and $$I_{Ref} \approx I_b+I_{DAC}. \quad (10)$$

In a task 226 of subprocess 218, quiescent bias current $I_{b2}$ for output stage 108 of RF power amplifier 102 is produced by bias regulator 104. Reference current $I_{Ref}$ passes through reference transistor. The value of reference current $I_{Ref}$ is reflected in base-emitter voltage $V_{be3}$. Base current $I_{b3}$ is a function of bias voltage $V_{Bias}$, base-emitter voltage $V_{be3}$, and the value of base resistor $R_{b3}$:

$$I_{b3}=(V_{Bias}-V_{be3})/R_{b3}. \quad (11)$$

This serves to establish bias source voltage $V_{Bias}$.

Since, as discussed hereinbefore, output and reference transistors $Q_2$ and $Q_3$ are fabricated upon the same substrate with a predetermined size ratio N, which ratio N is also present in base resistors $R_{b2}$ and $R_{b3}$, output-stage bias current (i.e., output-transistor base current) $I_{b2}$ is also determined:

$$V_{be3}=V_{be2}, \quad (12)$$

$$R_{b2}=N \cdot R_{b3}, \quad (13)$$

$$I_{b2}=(V_{Bias}-V_{be2})/R_{b2}=N \cdot I_{b3}. \quad (14)$$

Similarly, in a task 228 of subprocess 218, quiescent bias current $I_{b1}$ for driver stage 110 of RF power amplifier 102 is produced by bias regulator 104:

$$I_{b1}=(V_{Bias}-V_{be1})/R_{b1}=M \cdot I_{b3}. \quad (15)$$

Figure 5:
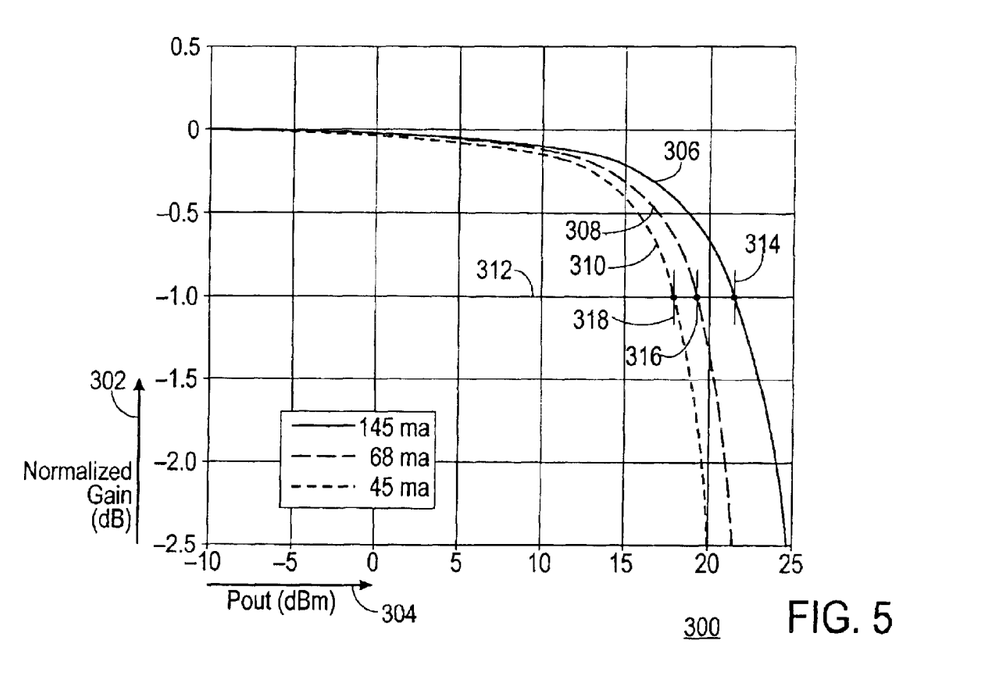
FIG. 5 depicts a graph of gain versus output power for multiple quiescent bias currents in accordance with a preferred embodiment of the present invention.

By properly adjusting current mirror circuit 114 under the control of system controller 116, subprocess 218 may produce any reasonable value for reference current $I_{Ref}$. This allows any reasonable value for output-stage bias current $I_{b2}$, and directly affects the performance of power amplifier 102. FIG. 5 depicts a graph 300 of normalized power amplifier gain 302 versus output power 304 for multiple quiescent output-transistor bias currents $I_{b2}$ in accordance with a preferred embodiment of the present invention. The gain curves are normalized with respect to their low level, small signal gains to better show relative behavior. The following discussion refers to FIGS. 1, 2, and 5.

FIG. 5 shows exemplary values of normalized output-current $I_{b2}$ for use with varying power-amplifier operating modes. For each of these curves, $V_{cc}$ is 3.0 volts, source resistance are nominally 50 Ω, and low-current frequency transistor current gains are nominally 80.

Curve 306 depicts normalized gain 302 versus output power 304 for an exemplary power amplifier with near class-A operation with a bias current $I_{c2}$ of 145 mA. At this bias, a −1 dB gain 312 results in an approximately +21.6 dBm output power 314. Curves 308 and 310 depict the results of lowering bias current $I_{c2}$ to operate more deeply towards class-AB operation. With curves 308 and 310, output power 304 at 1 dB gain compression has fallen substantially due to the effects of output current clipping with reduced quiescent bias. Curve 308 depicts normalized gain 302 versus output power 304 for class-AB operation with a bias current $I_{c2}$ of 68 mA. At this bias, a −1 dB gain 312 results in an approximately +19.1 dBm output power 316. Similarly, curve 310 depicts normalized gain 302 versus output power 304 for class-AB operation with a bias current $I_{c2}$ of 45 mA. At this bias, a −1 dB gain 312 results in an approximately +17.9 dBm output power 318.

Note, however, that the linearity at lower output power levels 304 is not degraded significantly as quiescent bias current $I_{c2}$ is reduced. In fact, although not shown explicitly in chart 300, the linearity in some class-AB amplifiers for quiescent currents $I_{c2}$ of 45 mA and below may improve slightly due to the effects of a gain extension characteristic as average collector current increases at increased output power levels 304 due to RF rectification.

Those skilled in the art will appreciate that curves 306, 308, and 310 are normalized to the same gain at low power. However, in reality, it is recognized that amplifier gain will drop slightly when DC quiescent bias is reduced.

As depicted in chart 300, power amplifier 102 operates with near full class-A quiescent bias in order to achieve adequate linearity at high output power 304 (on the order of +20 dBm). Chart 300 also shows that quiescent bias current $I_{b2}$ may be decreased when lower output operating power is acceptable. With lowered bias current $I_{b2}$, power amplifier 102 retains the desired linearity. Thus, efficiency can be improved at these lower operating power levels.

Figure 6:
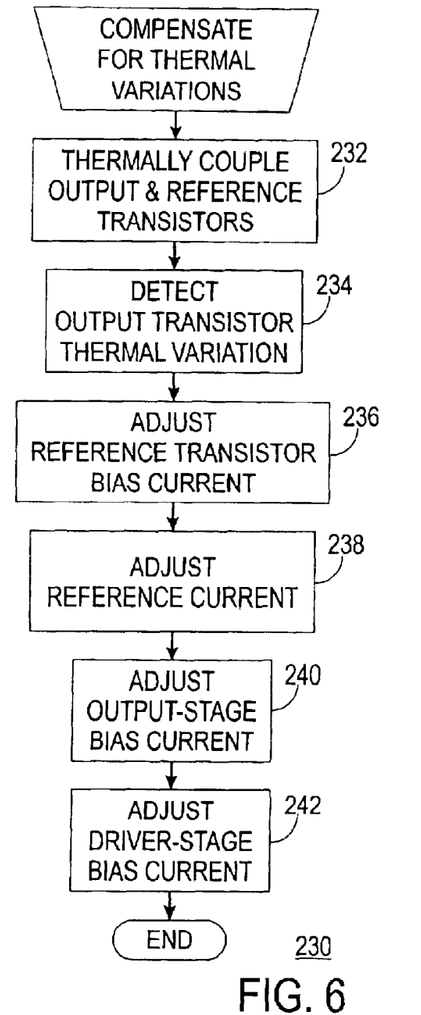
FIG. 6 depicts a flowchart of a subprocess to compensate quiescent bias currents for thermal variations in an RF power amplifier in accordance with a preferred embodiment of the present invention.

FIG. 6 depicts a flowchart of a subprocess 230 to compensate quiescent bias currents $I_{b1}$ ad $I_{b2}$ for thermal variations in RF power amplifier 102 in accordance with a preferred embodiment of the present invention. The following discussion refers to FIGS. 1, 2, and 6.

As discussed hereinbefore, reference transistor $Q_3$ is fabricated upon common substrate 122 with output and driver transistors Q2 and Q1 of power amplifier 102. This causes transistors Q1, Q2, and Q3 to be thermally coupled. It is this thermal coupling that allows subprocess 230 to function.

Once subprocess 218 has established quiescent bias currents $I_{b1}$ and $I_{b2}$ for RF power amplifier 102, then subprocess 230 of process 200 compensates quiescent bias currents $I_{b1}$ and $I_{b2}$ for thermal variations in power-amplifier substrate 122. In a pseudotask 232 of subprocess 230, driver, output and reference transistors $Q_1$, $Q_2$, and $Q_3$ are thermally coupled. Since, in subprocess 202 discussed hereinbefore, transistors $Q_1$, $Q_2$, and $Q_3$ were fabricated upon common substrate 122, transistors $Q_1$, $Q_2$, and $Q_3$ are inherently thermally coupled. Pseudotask 232, therefore, is not actually performed. Rather, pseudotask 232 is a confirmation of subprocess 202.

Power-amplifier substrate 122 is subject to thermal variations. These variations may be produced either as a result of environmental conditions or as a result of power consumption within power amplifier 102. In either case, thermal variations in substrate 122 lead to variations in the conductivity of the base-emitter junction of output transistor $Q_2$. This change in conductivity is detected in a task 234 as a bias offset (not shown) effecting a change in base-emitter voltage $V_{be2}$ of output transistor $Q_2$.

Since, due to the geometries of transistors $Q_2$ and $Q_3$, base-emitter voltages $V_{bc2}$ and $V_{be3}$ of are substantially equal, the bias offset is also induced at reference transistor $Q_3$. As a result, reference-transistor base-emitter voltage $V_{be3}$ changes to track output-transistor base-emitter voltage $V_{be2}$. A task 236 then adjusts reference-transistor bias current $I_{b2}$ for the change in base-emitter voltage $V_{be3}$.

In a task 238, reference transistor $Q_3$ responds to the change in bias and adjusts source transistor $Q_4$ to effect a change in reference current $I_{Ref}$ and bias source voltage $V_{Bias}$.

The change in reference current $I_{Ref}$ causes tasks 240 and 242 to adjust the output-stage and driver-stage bias currents $I_{b2}$ and $I_{b1}$ of output and driver transistors $Q_2$ and $Q_1$ of power amplifier 102. The action of subprocess 230 therefore results in reasonable temperature variations having only a small secondary effect upon the performance of RF power amplifier 102.

Those skilled in the art will appreciate that the process flow discussed herein in conjunction with subprocess 230 does not indicate sequence. Sequence is depicted only for clarity of description of the context of the process. For example, tasks 240 and 242 would be effected substantially simultaneously.

Figure 7:
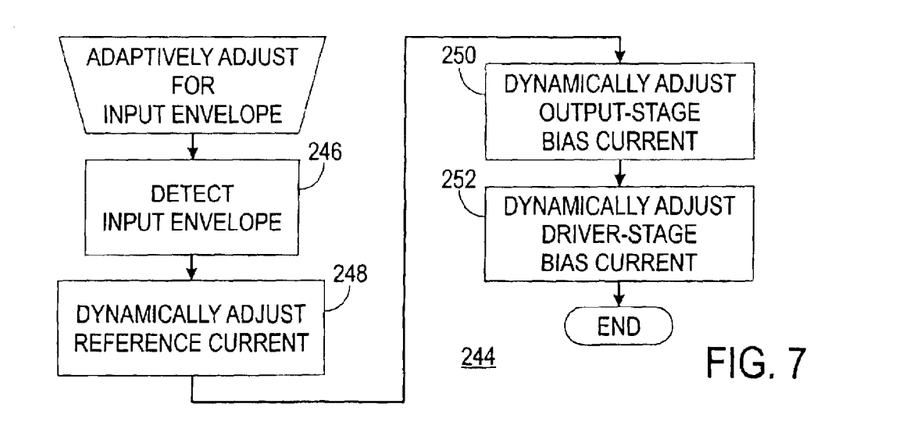
FIG. 7 depicts a flowchart of a subprocess to adaptively adjust bias currents for an RF power amplifier in response to an envelope of an input signal in accordance with a preferred embodiment of the present invention.

FIG. 7 depicts a flowchart of a subprocess to adaptively adjust bias currents for an RF power amplifier in response to an envelope of an input signal in accordance with a preferred embodiment of the present invention. The following discussion refers to FIGS. 1, 2, and 7.

Bias-management system 100 offers adaptive dynamic bias control in addition to the quiescent and thermal bias control discussed hereinbefore. In the preferred embodiment, one form of dynamic bias control is achieved through envelope detector 120. This form of dynamic bias control utilizes envelope detector 120 in conjunction with current-mirror circuit 114 to cause bias regulator 104 to dynamically vary the bias currents $I_{b1}$ and $I_{b2}$ of power amplifier 102.

In the absence of an RF input signal 126, envelope detector 120 produces a static envelope current $I_{Env}$. Static envelope current $I_{Env}$ is compensated for in current-mirror circuit 114 and has no significant impact upon power-amplifier quiescent bias currents $I_{b1}$ and $I_{b2}$. Envelope detector circuit 120 is typically designed to have very small quiescent output current when an RF input signal 128 near zero.

When RF input signal 128 is present, RF input signal 126 enters power amplifier 102 and is passed to envelope detector 120. In a task 246 of subprocess 244, envelope detector 120 detects (e.g., rapidly rectifies) RF input signal 126 to dynamically vary envelope current $I_{Env}$ in response to an envelope (not shown) of RF input signal 126. Envelope current $I_{Env}$ is assessed by current-mirror circuit 114 and produces variations in reference control current $I_{DAC}$. This effects, in a task 248, a dynamic adjustment of reference current $I_{Ref}$, and consequently bias currents $I_{b1}$ and $I_{b2}$. Reference current $I_{Ref}$ thus varies in response to the envelope of RF input signal 126. That is, dynamic components are added to the static DAC reference current to modulate the reference current $I_{Ref}$, based on the instantaneous RF envelope current $I_{Env}$.

The dynamic components of reference current $I_{Ref}$ are passed to bias voltage $V_{Bias}$ by reference transistor $Q_3$. These dynamic components are the passed to output transistor $Q_2$ in a task 250 and driver transistor $Q_1$ in a task 251. That is, dynamic components of driver and output bias currents $I_{b1}$ and $I_{b2}$ are developed. This results in dynamic bias control of driver stage 110 and output stage 108 of power amplifier 102 in response to RF input signal 126.

In the preferred embodiment, both the driver stage and output stage biases are controlled together. Those skilled in the art will appreciate that a suitable alternative is that only the output stage be so controlled, with the driver stage bias operated at a constant bias level. The use of this or other potential alternatives does not depart from the spirit of the present invention.

Reference transistor $Q_3$ and regulator transistor $Q_4$ of bias regulator 104 should respond at speeds that are fast relative to the bandwidth of the envelope of RF input signal 126. This results in a response bandwidth of at least 50 MHz for IEEE 802.11 signals. This dynamic bias control is achieved with current-mirror circuit 114 in preprocessor 106. In current-mirror circuit 114, the RF signal level represented in $I_{Env}$, and the output device base-currents, represented in collector current $I_{c4}$, can be combined to generate a desirable dynamic correction profile for reference current $I_{Ref}$.

In addition, the preferred embodiment of the present invention includes provisions for DAC 112 to produce reference control current $I_{DAC}$ to control the amount of static DC current in reference current $I_{Ref}$. This in turn sets the small-signal quiescent DC current of output transistor $Q_2$. Desirably, both the quiescent DC current and the amount of RF-envelope dependent correction can be programmed digitally by controller 116 to optimize the efficiency and linearity of output transistor $Q_2$ for a given radio operation mode.

In essence, the preferred embodiment of the present invention detects RF input signal 128 at an appropriate point 120 in the signal path. Additionally, a base current demand of transistors $Q_1$ and $Q_2$ changes in response to RF input signal 126. This change in base current demand is sensed in a collector current $I_{c4}$ of source transistor $Q_4$ and is approximated by the equation:

$$I_{b2} \cong I_{b1}, \qquad (16)$$

where it is assumed that base current $I_{b3}$ of reference transistor $Q_3$ is much smaller than the sum of base currents $I_{b1}$ plus $I_{b2}$.

Reference current $I_{Ref}$ (i.e., the collector current $I_{c3}$ of reference transistor $Q_3$) is generated as the sum of control currents from DAC 112 and current-mirror circuit 114 as follows:

$$I_{Ref} = k_1 \cdot I_{Env} + k_2 \cdot I_{c4} + I_{DAC}, \qquad (17)$$

where $k_1$ and $k_2$ are selectable gain-ratio constants of current-mirror circuit 114. Reference control current $I_{DAC}$ and current-mirror gain ratio constants $k_1$ and $k_2$ may be programmed by system controller 116.

It should be noted that dynamic biasing can still be achieved if either of the two signal-dependent terms $I_{Env}$ and $I_{c4}$ in equation (17) is set equal to zero by setting either constant $k_1$ or $k_2$ to zero. In some embodiments, efficiency and linearity improvement may be adequate with only one control mechanism present in the design.

Figure 8:
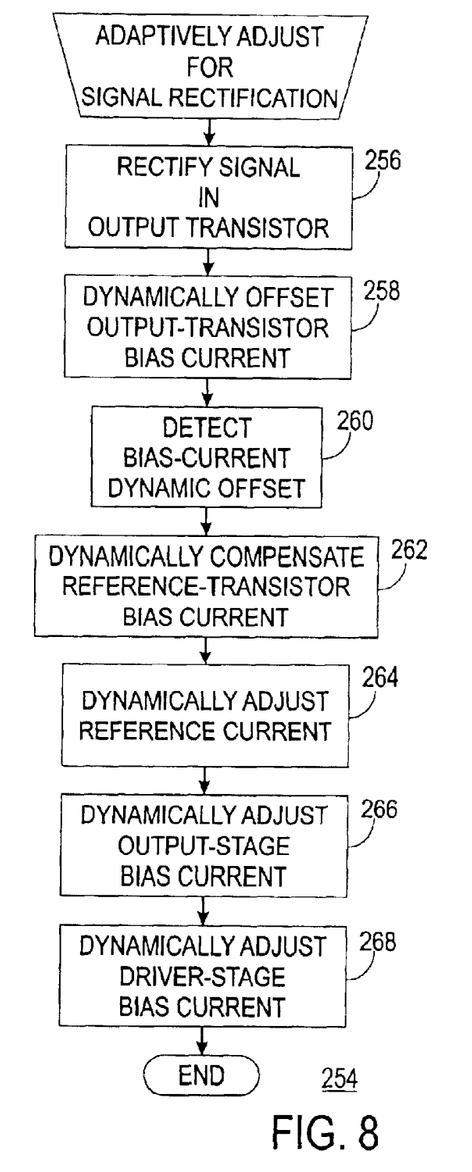
FIG. 8 depicts a flowchart of a subprocess to adaptively adjust bias currents for an RF power amplifier in response to signal rectification in an output stage of the power amplifier in accordance with a preferred embodiment of the present invention.

FIG. 8 depicts a flowchart 254 of a subprocess to adaptively adjust bias currents $I_{b1}$ and $I_{b2}$ for RF power amplifier 102 in response to signal rectification in output stage 108 in accordance with a preferred embodiment of the present invention. The following discussion refers to FIGS. 1, 2, and 7.

The preferred embodiment of the present invention compensates for compression induced by an increase in signal strength when output transistor $Q_2$ is biased for class-AB or class-B operation. When the RF signal level increases to large levels, the average base current demand of output transistor $Q_2$ goes up, due to rectification of the RF transistor current at the base. Since the current can only be supplied through $R_{b2}$ from $V_{Bias}$, the average base-emitter DC voltage bias $V_{be2}$ of output transistor $Q_2$ decreases. This de-biasing effect results in further compression of the output characteristics with increasing power levels. This mechanism contributes to output power compression in all similar fixed current-source-biased power amplifier output stages and is well known to those skilled in the art. When average bias voltage $V_{be2}$ is decreased with an increase in signal level, the compression characteristic of a power amplifier becomes softer and results in a notable increase in distortion at the higher power levels.

Ideally, bias current $I_{b2}$ should increase with an increase in signal level to offset compression. This is accomplished in subprocess 254 passing the bias offset generated by signal rectification in output stage 108 to bias controller 104. Bias controller 104 in turn adjusts bias currents Ib1 and Ib2 of power amplifier 102 to compensate for the bias offset.

RF input signal 128 enters driver stage 110 of RF power amplifier 102. Within driver stage 110, RF input signal 128 is amplified to become a RF intermediate signal 130. RF intermediate signal 130 passes from driver stage 110 to output stage 108 of RF power amplifier 102. Within output stage 108, RF intermediate signal 130 is amplified to become an RF output signal 132.

In a task 256, RF intermediate signal 130 is rectified by the base-emitter junction of output transistor $Q_2$ during amplification. This rectification, which is most evident when output transistor Q2 is operating in class-AB or class-B mode, produces a bias offset (not shown). In a task 258, the bias offset is summed with base-emitter voltage $V_{be2}$ and bias current $I_{b2}$ is dynamically lowered. Since base-emitter voltages $V_{be2}$ and $V_{be3}$ of output and reference transistors $Q_2$ and $Q_3$ are always substantially equal, a task 260 detects the presence of the bias offset and adjusts the base-emitter voltage $V_{be3}$ of reference transistor $Q_3$ accordingly. In a task 262, the base current $I_{b2}$ of reference transistor $Q_3$ is dynamically compensated. This results in a dynamic adjustment of reference current $I_{Ref}$ in a task 264. Dynamically adjusted reference current $I_{Ref}$ in turn results in dynamically adjusted output-stage and driver-stage bias currents $I_{b2}$ and $I_{b1}$ in tasks 266 and 268.

Figure 9:
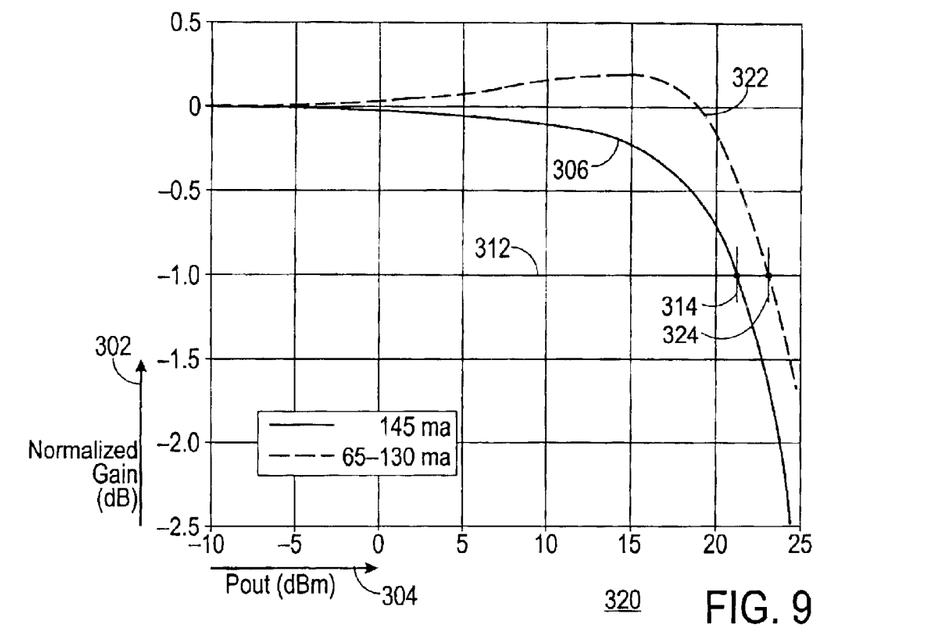
FIG. 9 depicts a graph of gain versus output power for quiescent and dynamic bias currents in accordance with a preferred embodiment of the present invention.

FIG. 9 depicts a graph 320 of normalized gain 302 versus output power 304 for quiescent and dynamic output-stage bias currents $I_{b2}$ and $I_{b1}$ in accordance with a preferred embodiment of the present invention. The following discussion refers to FIGS. 1 and 9.

Curve 306 depicts normalized gain 302 versus output power 304 for near class-A operation with a fixed bias current $I_{b2}$ of 145 mA. At this bias, a −1 dB gain 312 results in an approximately +21.6 dBm output power 314.

Curve 322 depicts normalized gain 302 versus output power 304 for near class-A operation with a dynamic bias current $I_{b2}$ of 65–130 mA under control of bias-management system 100. At this bias, a −1 dB gain 312 results in an approximately +23 dBm output power 324. This represents a significant increase in output power 304 while average quiescent bias current $I_{b2}$ has decreased. Moreover, dynamic-bias curve 322 demonstrates that gain 302 exhibits a slight expansion as the DC-bias level is increased over the range. After taking into account compression characteristics of power-amplifier driver stage 110, linearity has improved substantially over the range of output power 304 as compared to a fixed-bias scheme.

In the preferred embodiment, with dynamic bias regulator 104 configured as shown in FIG. 1, quiescent output bias current $I_{b2}$ will automatically drop to approximately 65 mA when the envelope level is small. Thus, with OFDM signals, where the peak to average envelope level can vary as much as 12 dB, the average quiescent bias current will be much lower than 130 mA and closer to 75 mA. Since linearity is also improved, the operating output power back-off level relative to amplifier compression that is consistent with full signal fidelity will also be reduced, resulting in higher output power.

Accordingly, subprocess 254 achieves operating power efficiency improvement with active dynamic bias, relative to fixed bias, provided the RF signal is amplitude modulated. Also, an increase of 1–2 dBm in output power 304 is possible for these waveforms with active dynamic biasing under the constraint of a fixed power-amplifier collector voltage $V_{cc}$.

Figure 10:
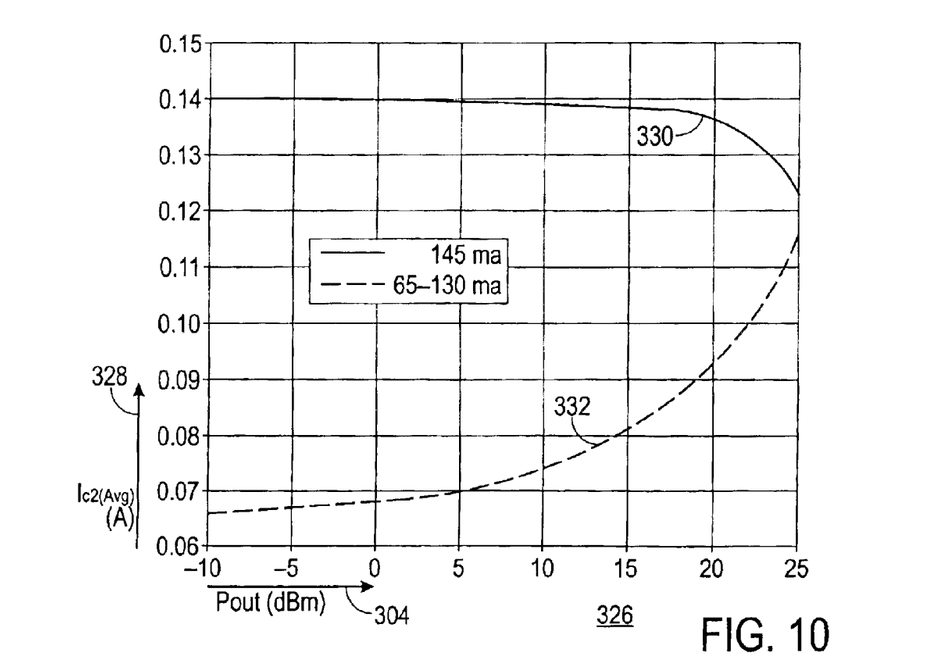
FIG. 10 depicts a graph of average collector current versus output power for quiescent and dynamic bias currents in accordance with a preferred embodiment of the present invention.

FIG. 10 depicts a graph 326 of average collector current 328 versus output power 304 for quiescent and dynamic output-stage bias currents $I_{b2}$ in accordance with a preferred embodiment of the present invention. The following discussion refers to FIGS. 1 and 10.

Curve 330 depicts average collector current 328 with quiescent bias of 145 mA for a fixed bias current $I_{b2}$. Curve 322 depicts average collector current 328 with quiescent bias varied between 65 mA and 130 mA as a function of output envelope power level for a variable dynamic bias current $I_{b2}$. Note that for fixed-bias curve 330, average quiescent bias current $I_{b2}$ falls off at higher powers when power amplifier 102 enters compression. This is due to finite DC base resistance $R_{b2}$ and the fact that at higher power levels the average demand on base current $I_{b2}$ increases due to saturation and rectification of the RF signal.

Operating power consumed from the power supply (and hence the efficiency of power amplifier 102) will be determined by a weighted average based on the signal envelope output power distribution.

The adaptive algorithms of the present invention determine an efficient operating mode for power amplifier 102 that is compatible with both output level and radio modulation mode linearity requirements. Then the parameters of bias regulator 104 are programmed digitally, typically based on a pre-programmed look-up-table in a manner well known to those skilled in the art, to optimize performance and efficiency of power amplifier 102 for the selected radio operating mode.

In summary, the present invention teaches a bias-management system 100 and method 200 for a programmable RF power amplifier 102. Bias-management system 100 optimizes the performance of RF power amplifier 102 for multiple radio operating modes. A reference transistor $Q_3$ of a bias regulator 104 and an output transistor $Q_2$ of power amplifier 102 are integrated upon a common substrate 122 to provide close thermal coupling between bias regulator 104 and power amplifier 102. A bias current $I_{b2}$ for power amplifier 102 is dynamically adjusted as a function of an envelope of an RF input signal 126 and to compensate for signal rectification within an output stage 108 of power amplifier 102.

Although the preferred embodiments of the invention have been illustrated and described in detail, it will be readily apparent to those skilled in the art that various modifications may be made therein without departing from the spirit of the invention or from the scope of the appended claims.

What is claimed is:

1. An RF power-amplifier bias-management system comprising:
    a controller configured to select a radio operating mode;
    a current-mirror circuit coupled to said controller and configured to produce a reference control current as a function of said radio operating mode;
    a bias regulator coupled to said controller, coupled to said current-mirror circuit, and configured to respond to said reference current; and
    a power-amplifier output stage coupled to said bias regulator and having a bias current determined by said bias regulator.

2. A system as claimed in claim 1 additionally comprising a power-amplifier driver stage coupled to said bias regulator and having a bias current determined by said bias regulator.

3. A system as claimed in claim 2 additionally comprising a DC-to-DC converter coupled to said controller and configured to provide a supply voltage for said output stage and said driver stage in response to said radio operating mode.

4. A system as claimed in claim 1 additionally comprising a DC-to-DC converter coupled to said controller and configured to provide a supply voltage for said output stage in response to said radio operating mode.

5. A system as claimed in claim 1 wherein:
    said bias regulator comprises a reference transistor;
    said output stage comprises an output transistor; and
    said reference transistor and said output transistor are formed upon a common substrate.

6. A system as claimed in claim 5 wherein:
    said reference transistor is thermally coupled to said output transistor through said common substrate; and
    said bias regulator is configured so that changes in conductivity of said output transistor due to thermal variations are compensated for by proportionate changes in conductivity in said reference transistor.

7. A system as claimed in claim 1 wherein:
    said system additionally comprises an envelope detector coupled to said current-mirror circuit and configured to produce an input-signal envelope current in response to an RF input signal; and
    said current-mirror circuit is configured to produce said reference current as a function of said radio operating mode and said input-signal envelope current.

8. A bias-management system for a transmitter power amplifier, said system comprising:
    a current-mirror circuit configured to produce a quiescent reference current in response to a digital control signal;
    a bias regulator coupled to said current-mirror circuit and configured to respond to said quiescent reference current; and
    an output stage coupled to said bias regulator and having a quiescent bias current in response to said bias regulator.

9. A system as claimed in claim 8 additionally comprising a driver stage coupled to said bias regulator and having a quiescent bias current in response to said bias regulator.

10. A system as claimed in claim 8 wherein:

said bias regulator comprises a reference transistor;

said output stage comprises an output transistor;

said reference transistor is thermally coupled to said output transistor through a common substrate; and said bias regulator is configured so that changes in conductivity of said output transistor due to thermal variations in said common substrate are compensated for by proportionate changes in conductivity in said reference transistor.

11. A system as claimed in claim 8 wherein:

said system additionally comprises an envelope detector configured to produce an envelope current in response to an RF input signal;

said current-mirror circuit is configured to produce said quiescent reference current in response to said digital control signal, and is further configured to dynamically alter said quiescent reference current into a dynamic reference current in response to said envelope current;

said bias regulator is configured to respond to said dynamic reference current; and said output stage has a dynamic bias current in response to said bias regulator.

12. A bias-management system for a transmitter power amplifier, said system comprising:

a driver stage having a driver-stage bias current with quiescent and dynamic components;

an output stage coupled to said driver stage and having an output-stage bias current with quiescent and dynamic components;

a bias regulator coupled to said driver and output stages and configured to provide said driver-stage and output-stage bias currents; and a current-mirror circuit coupled to said bias regulator and configured to establish said quiescent components of said driver-stage and output-stage bias currents.

13. A system as claimed in claim 12 wherein:

said driver stage is configured to amplify an input signal into an intermediate signal, and to pass said intermediate signal on to said output stage;

said output stage rectifies a portion of said intermediate signal to produce a dynamic bias offset, and passes said dynamic bias offset to said bias regulator; and said bias regulator establishes said dynamic components of said driver-stage and output-stage bias currents in response to said dynamic bias offset.

14. A system as claimed in claim 12 wherein:

said system additionally comprises an envelope detector coupled to said driver stage and to said current-mirror circuit, and configured to produce an envelope current in response to an RF input signal; and said current-mirror circuit is configured to produce both said quiescent and said dynamic components of said driver-stage and output-stage bias currents.

15. A system as claimed in claim 12 wherein:

said output stage comprises an output transistor fabricated upon a substrate;

said bias regulator comprises a reference transistor fabricated upon said substrate;

said output stage develops a bias offset in response to a thermal variation of said substrate; and said bias regulator compensates said output-stage bias current for said bias offset.

16. A system as claimed in claim 12 wherein:

a portion of said output stage comprising an output transistor is fabricated upon a first substrate;

a portion of said bias regulator comprising a reference transistor is fabricated upon said first substrate; and said current-mirror circuit is fabricated upon a second substrate.

17. A system as claimed in claim 16 wherein a portion of said driver stage comprising a driver transistor is fabricated upon said first substrate.

18. A system as claimed in claim 16 wherein said first substrate supports components fabricated using a first integrated-circuit technology; and said second substrate supports components fabricated using a second integrated-circuit technology different from said first integrated-circuit technology.

19. A method of adaptively controlling operation of an RF power amplifier, said method comprising:

selecting a radio operating mode;

producing, within a current-mirror circuit, a reference current in response to said selecting activity;

establishing, within a bias regulator, a bias current for an output stage of said power amplifier in response to said producing activity; and determining a supply voltage for said power amplifier in response to said selecting activity.

20. A method as claimed in claim 19 additionally comprising establishing a bias current for a driver stage of said power amplifier in response to said producing activity.

21. A method as claimed in claim 19 additionally comprising:

a) fabricating a portion of said power amplifier comprising an output transistor upon a first substrate;

b) fabricating a portion of said bias regulator comprising a reference transistor upon said first substrate; and c) fabricating said current-mirror circuit upon a second substrate.

22. A method as claimed in claim 21 additionally comprising fabricating a portion of said power amplifier comprising a power transistor upon said first substrate.

23. A method as claimed in claim 21 wherein:

said fabricating activities a) and b) use a first integrated-circuit technology; and said fabricating activity c) uses a second integrated-circuit technology different from said first integrated-circuit technology.

24. A method as claimed in claim 21 additionally comprising:

thermally coupling said reference transistor to said output transistor through said first substrate; and compensating for thermal changes in said output transistor by effecting thermal changes in said reference transistor.

25. A method as claimed in claim 19 wherein:

said method additionally comprises detecting an envelope current in response to an RF input signal; and said producing activity produces said reference current in response to said detecting activity.

26. A method as claimed in claim 19 wherein:

said method additionally comprises rectifying a portion of an RF signal to produce a bias offset; and said establishing activity establishes said bias current in response to said producing and rectifying activities.

* * * * *

UNITED STATES PATENT AND TRADEMARK OFFICE
CERTIFICATE OF CORRECTION

PATENT NO. : 6,831,517 B1
DATED : December 14, 2004
INVENTOR(S) : Hedberg et al.

It is certified that error appears in the above-identified patent and that said Letters Patent is hereby corrected as shown below:

Column 8,
Line 32, reads "$I_b$.", should read -- $I_{b4}$. --

Column 9,
Line 20, reads "output-current", should read -- output-stage bias current --
Line 22, reads "and low-current", should read -- and mid-current --

Column 10,
Line 27, reads "$V_{bc2}$" should read -- $V_{be2}$ --

Column 11,
Line 59, equation 16, reads "$I_{b2}=I_{b1}$", should read -- $I_{c4}=I_{b2}+I_{b1}$ --

Signed and Sealed this

First Day of March, 2005

JON W. DUDAS
*Director of the United States Patent and Trademark Office*